United States Patent
Tsunoda

[11] Patent Number: 5,863,808
[45] Date of Patent: Jan. 26, 1999

[54] METHOD OF STORING AND TRANSPORTING WAFERS AND METHOD OF DETERMINING THE AMOUNT OF ORGANIC MATERIALS ATTACHED TO STORED WAFERS

[75] Inventor: Hitoshi Tsunoda, Nishigou-mura, Japan

[73] Assignee: Shin-Etsu Handotai Co., Ltd., Tokyo, Japan

[21] Appl. No.: 706,070

[22] Filed: Aug. 30, 1996

[30] Foreign Application Priority Data

Aug. 30, 1995 [JP] Japan .................................. 7-245465

[51] Int. Cl.$^6$ .................................................. G01R 31/26
[52] U.S. Cl. .................................. 438/18; 438/16; 438/17
[58] Field of Search ............................... 437/8; 438/14, 438/15, 16, 18, 17

[56] References Cited

U.S. PATENT DOCUMENTS 5,105,628  4/1992  Nakai ........................................... 62/78
5,551,984  9/1996  Tanahashi ................................ 118/724

FOREIGN PATENT DOCUMENTS 01-129836  9/1989  Japan .
04-84431   3/1992  Japan .
484431A    3/1992  Japan .
WO 92/19012 10/1992 WIPO .

*Primary Examiner*—Chandra Chaudhari
*Assistant Examiner*—Reneé R. Berry
*Attorney, Agent, or Firm*—Evenson, McKeown, Edwards & Lenahan, P.L.L.C.

[57] ABSTRACT

The invention is predicated in an experimental finding that by setting the temperature in a wafer case, which is made of polypropyrene or like organic resin and in which wafers are stored, to −50° to 15° C., preferably to −50° to 10° C., it is possible to make the increase of organic materials attached during the storage of the wafers substantially to zero. The invention also concerns a method of determining the amount of organic materials attached to wafers, which comprises the steps of allowing a predetermined amount of water drop to be formed on the surface of a wafer, then measuring the angle α between the wafer and a line drawn from the contact point of 3 phases consisting of the water drop 10, the wafer 1 and gas on the wafer surface to the top of the water drop 10, and thereby obtaining the contact angle θ as θ=2α, and then determining the amount of organic materials from the contact angle θ.

10 Claims, 4 Drawing Sheets

METHOD OF STORING AND TRANSPORTING WAFERS AND METHOD OF DETERMINING THE AMOUNT OF ORGANIC MATERIALS ATTACHED TO STORED WAFERS

BACKGROUND OF THE INVENTION

1. Field of the Invention

This invention relates to a method of storing and/or transporting wafers and a method of determining the amount of organic materials attached to stored wafers, and more particularly, to a method of storing and/or transporting wafers in case when non-patterned wafers are stored in a container made of polypropyrene or like organic resins and a method of determining the amount of organic materials attached to stored wafers.

2. Description of the Related Art

In the prior art, it has been a practice that semiconductor wafers, i.e., mirror finished wafers obtained by slicing wafers from an ingot and then polishing, grinding and cleaning the sliced wafers, are transported to an integrated circuit manufacturer for carrying out predetermined patterning processes such as photo-lithography, etching and heat treatment and thin film formation, etc.

The semiconductor wafer manufacturer thus has to supply non-patterned wafers to the integrated circuit manufacturer. The non-patterned wafers obtained after the mirror finishing or after eptaxial growth, have to be accommodated in a wafer case for storage or transport.

FIG. 4 shows a wafer case 50 to this end, which is disclosed in Japanese Laid-Open Utility Model Registration No. 1-129836. As shown, the wafer case 50 comprises a wafer basket 53, which has wafer support grooves 55 for supporting a plurarity of wafers 1 in parallel, a wafer case body 50 for accommodating the wafer basket 53, a wafer case cover top 52 for closing a top opening of the wafer case body 50, and a wafer retainer 54 for retaining the wafers 1 supported in the wafer basket 53.

The wafer case 50 is usually made of polypropyrene, polycarbonate or like organic resins, and it is inevitable that organic materials are dispersed (by volatile emission) from the components of a wafer case. The dispersed organic materials may be attached or adsorbed to the wafers in the wafer case to cause various troubles.

The applicant has earlier proposed, in connection with an SOI structure wafer comprising two mirror finished wafers bonded together via an oxide film formed by thermally oxidizing one of the wafers, a method of storing wafers, in which mirror finished and cleaned wafers are stored in a clean atmosphere free from organic materials until the bonding thereof to prevent the organic materials noted above from being attached or adsorbed to the wafer surfaces and forming numerous non-bonding micro points voids thereon (as disclosed in Japanese Laid-Open Patent Publication No. 4-84431).

With a wafer case made of polypropyrene or like organic resins, however, it is impossible to store wafers in a clean atmosphere free from organic materials, and various attempts have been made to solve this problem.

SUMMARY OF THE INVENTION

An object of the invention is to provide a method of storing and/or transporting wafers, which permits simple storage and/or transport of wafers without possibility of attachment or adsorption of organic materials but in a high quality state even in a wafer case made of polypropyrene or like organic materials.

Another object of the invention is to provide a method of determining the amount of organic materials, which permits simple reliable and accurate determination of the amount of organic materials attached to wafers stored in the wafer case made of organic resin.

The above objects of the invention are attained by an experimental finding that, when storing wafers in a wafer case made of polypropyrene like organic resins, setting the inner temperature of the case to −50° to 15° C., preferably −50° to 10° C., has an effect of greatly reducing the attachment or adsorption of organic materials to the wafer surfaces, more specifically making the increase of attached or adsorbed organic materials during storage of wafers substantially zero. The invention is predicated in this finding.

The wafers which are stored and/or transported according to the invention are mirror finished and/or cleaned non-patterned wafers or epitaxially grown and/or cleaned wafers, but have no sense of limiting it, may also be patterned wafers or non-finished wafers so long as these wafers are stored in a wafer case made of an organic resin.

The upper limit of the storage temperature is set to 15° C., preferably 10° C., on the basis of results of experiments shown in FIGS. 1 and 2 to be described later. The lower limit of the temperature is set to −50° C., because in the present freezer industry it is difficult to produce atmosphere temperatures below −50° C.

According to the invention as summarized above, wafers can be stored and/or transported without possibility of attachment or adsorption of organic materials to them and in a high quality state even in a wafer case made of polypropyrene or like organic materials.

According to the invention, a contact angle mensuration is used as the method of determining the amount of organic materials attached to wafer.

The contact angle mensuration is based on the facts that the wafer surface is hydrophilic due to its chemical liquid treatment and organic materials are mostly hydrophobic, and it utilizes the surface tension of a water drop (i.e., pure water drop) for the determination.

As shown in FIGS. 3(A) and 3(B), when the surface of a wafer 1 is contaminated by a hydrophobic organic material, the surface tension of a predetermined amount of water drop 10 allowed to be formed on the wafer surface is increased. This surface tension increase means a corresponding contact angle increase.

The contact angle is defined as the angle of the tangent to the water drop 10 at the position of the contact between the water drop 10 and the surface of the wafer 1. Actually, however, it is difficult to measure this angle.

As shown in FIG. 3(A), the invention features allowing a predetermined amount of pure water drop 10 to be formed on the surface of the wafer 1, then measuring the angle a between the wafer 1 and the line drawn from the contact point of 3 phases consisting of the water drop 10, the wafer 1 and gas on the wafer surface to the top of the water drop 10 and thereby obtaining the contact angle $\theta$ as $\theta=2\alpha$, then determine the amount of organic material attached to the wafer from the contact angle $\theta$.

Figure 1:
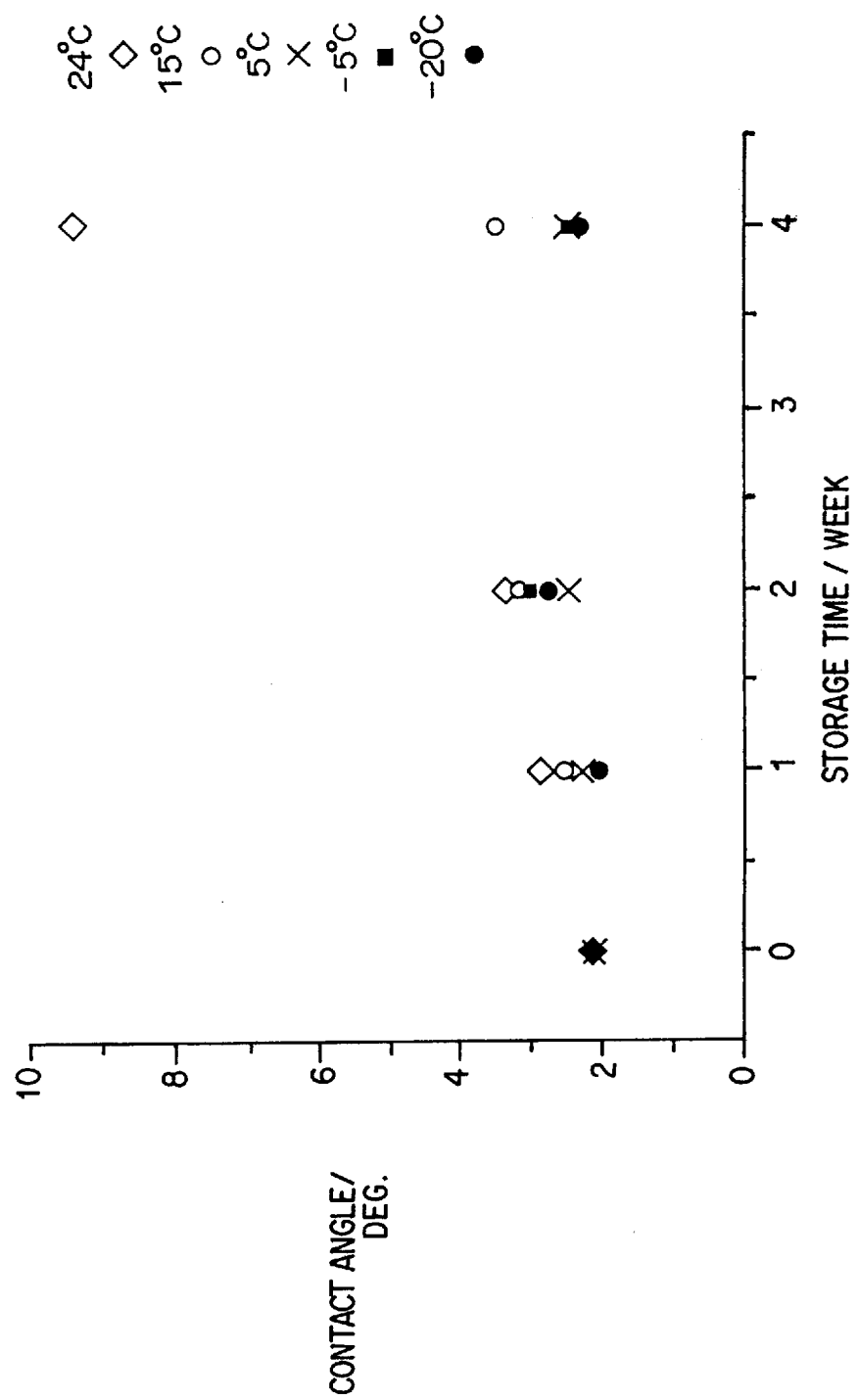
FIG. 1 is a graph showing the storage time dependency of the contact angle at various storage temperatures of wafer 1.

In the Figures, reference numeral 1 designates a wafer, and reference numerals 50 to 54 designate various components of a wafer case.

DETAILED DESCRIPTION OF THE PREFERRED EMBODIMENT

An embodiment of the invention will now be described with reference to the drawings.

Unless specifically noted, the sizes, materials, shapes relative dispositions, etc. of constituent parts described in connection with the embodiment have no sense of limiting the scope of the invention but are merely exemplary.

According to the invention, as test wafers 1 were used 6 inch wafers having a diameter of 150 mm$\phi$, obtained by mirror finishing and cleaned wafers sliced from a Si single crystal ingot.

Figure 4:
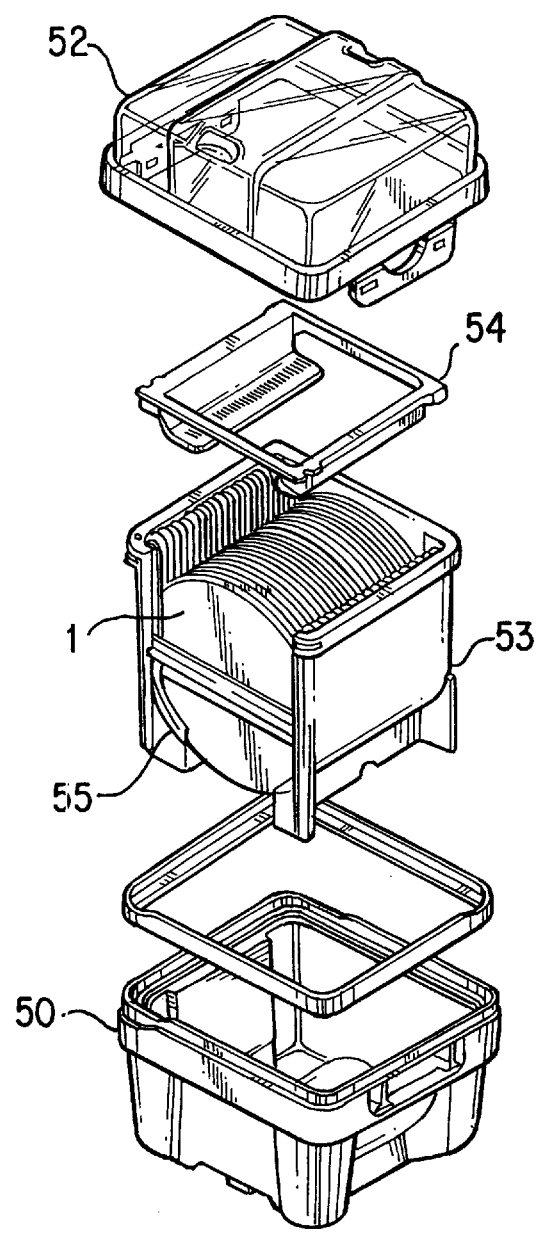
FIG. 4 is an exploded perspective view showing a wafer case used in accordance with the invention.

A plurarity of mirror finished and cleaned wafers 1 were erected in parallel in the support grooves 55 of the polypropyrene wafer basket 53 as shown in FIG. 4. The wafer basket 53 was then accommodated in the wafer case body 50 with the wafer retainer 54 retaining the wafers 1, and then the top opening of the wafer case body 50 was closed with the wafer case top cover 52. Then, the inside of the wafer case body 50 is substituted for with semiconductor grade high purity $N_2$ gas substantially containing no organic material, and the wafer case top cover 52 and the wafer case body 50 were sealed together with adhensive tape.

Wafer cases accommodating wafers 1 as above were prepared in five groups of five cases each, and the cases in each group were accommodated in a temperature controlled vessel capable of controlling the temperature between −20° and 25° C.

The wafers 1 were stored for four weeks by holding the temperatures of the temperature controlled vessels at 24, 15, 5, −5° and −20° C., respectively, and the amount of organic materials attached to the stored wafers 1 were determined.

The amount of organic materials attached to the wafers 1 was determined by the contact angle mensuration by taking out the wafer case for every week.

FIG. 1 shows the results of determination.

In the Figure, average values each of measurements obtained by the contact angle mensuration for nine points in the surface of four wafers 1 (9×4=36 points) were shown respectively.

As is seen from the graph, the amount of attached organic materials was quickly increased after storing for four weeks in the conventional method of storing at normal temperature (i.e., 24° C.). At 15° C., the increase was slight. At 5° C. and below, the initial value (when no volatile organic material from the case was attached) was not substantially changed.

Thus, by setting the temperature in the wafer case made of organic resin to 15° C. or below, preferably 10° C. or below, when storing wafers 1 in the device, it is possible to greatly reduce organic materials attached to the wafer surface or reduce increase of the attached organic materials during the storage of wafers substantially to zero.

Figure 2:
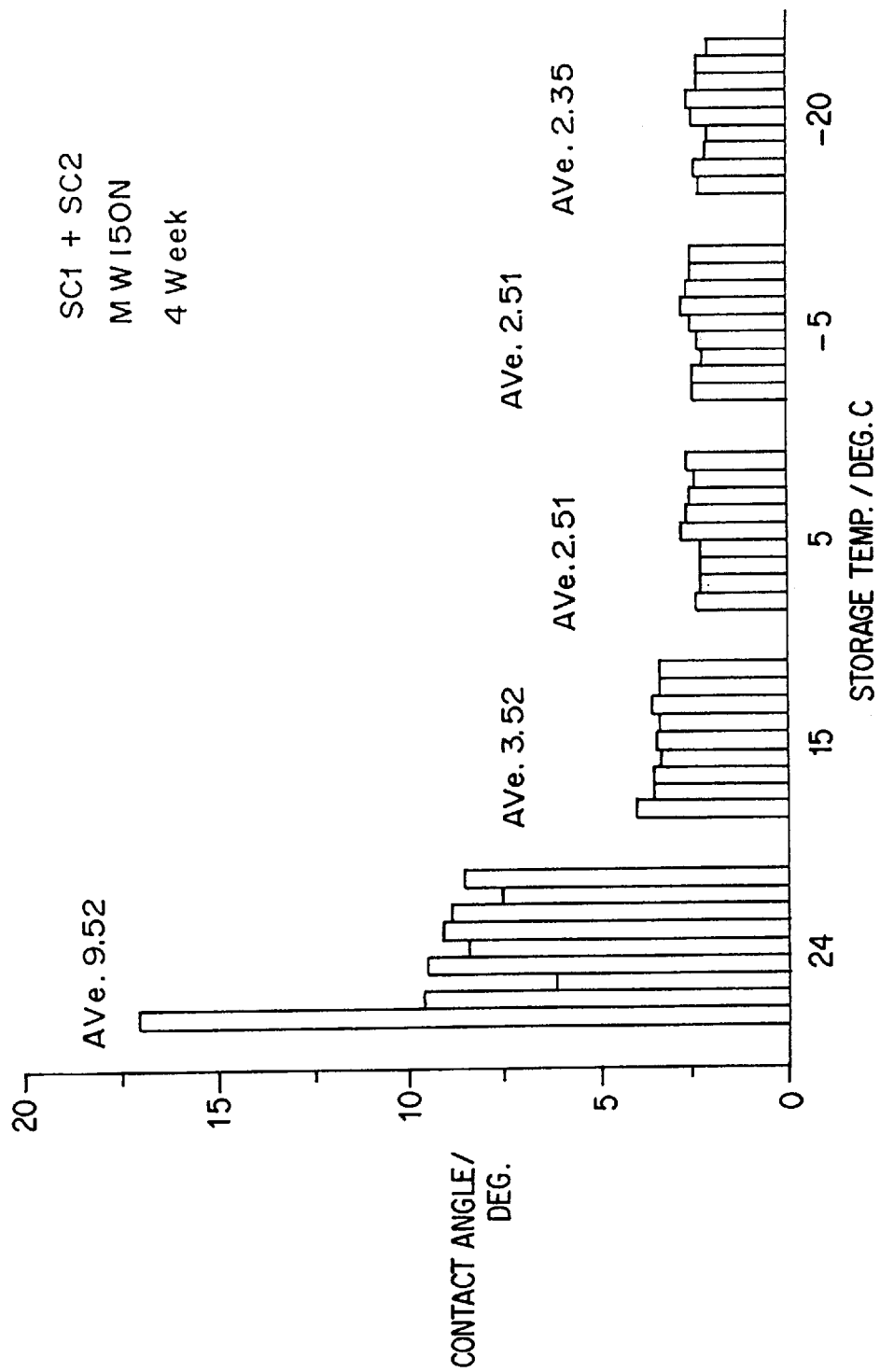
FIG. 2 is a graph showing the contact angle after storing wafer 1 for a predetermined period of time at various storing temperatures.

As shown in FIG. 2, the average contact angle of each wafer 1 at nine points of the surface (9×4 =36 points ) after storage for four weeks, did not fluctuate with the wafers 1 stored at 15° C. or below, but fluctuated with those stored at 24° C. This is thought to be due to the attachment of more organic materials dispersed from the wafer case inner walls to closer positions.

With the wafers 1 stored at 15° C. or below, the contact angle did not fluctuate owing to attachment of substantially no organic materials.

The method of measuring the contact angle will now be described.

Figure 3A:
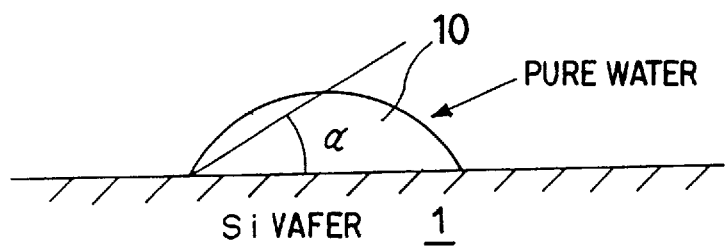
FIGS. 3(A) and 3(B) illustrate a contact angle method for determining the amount of organic materials attached to wafer 1, FIG. 3(A) being a view illustrating a method of actually measuring the contact angle, FIG. 3(B) being a view illustrating the principles underlying the method.
Figure 3B:
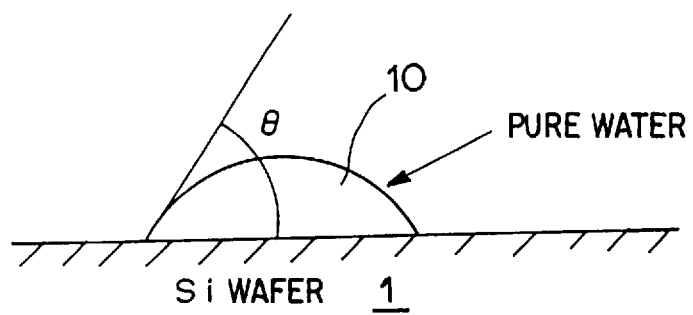

As shown in FIG. 3A, a predetermined amount of pure water drop 10 is allowed to be formed on the wafer surface by using a syringe.

When the water drop 10 has been spread, the angle $\alpha$ between the wafer 1 and the line drawn from the 3 phases contact point of the water drop 10, wafer 1 and gas on the wafer surface to the top of the water drop 10 is measured, and the contact angle $\theta$ is determined as $\theta=2\alpha$.

Correlation between the amount of organic materials determined by the above method and that determined by a thermal desorption gas chromatograph mass spectrometry was obtained, and a very high probability of presence of correlation was confirmed.

What is claimed is:

1. A method of storing and/or transporting wafers in a wafer case made of an organic resin, wherein:

the temperature in the wafer case is set to −50° to 15° C.

2. The method of storing and/or transporting wafers according to claim 1, wherein:

the temperature in the wafer support device is set to −50° to 10° C.

3. The method of storing and transporting wafers according to claim 1, wherein the wafers that are stored are mirror finished and/or cleaned, non-patterned wafers.

4. The method of storing and transporting wafers according to claim 1, wherein the wafers that are stored are epitaxially grown and/or cleaned wafers.

5. A method of determining the amount of organic materials attached to wafers stored in a wafer support device made of an organic resin comprising the steps of:

allowing a pure water drop to be formed on the surface of a wafer;

then measuring the angle $\alpha$ between the wafer and a line drawn from the contact point of 3 phases consisting of the water drop, the wafer and gas on the wafer surface to the top of the water drop;

thereafter obtaining the contact angle $\theta$ from the measured angle $\alpha$ according to the formula $\theta=2\alpha$; and then determining the amount of organic materials attached to the wafer from the contact angle $\theta$.

6. The method of storing and transporting wafers according to claim 2, wherein the wafers that are stored are mirror-finished and/or cleaned, non-patterned wafers.

7. The method of storing and transporting wafers according to claim 2, wherein the wafers that are stored are epitaxially grown and/or cleaned wafers.

8. A method according to claim 1, wherein the temperature in the wafer case is maintained at 5° C. or below.

9. A method according to claim 1, wherein said wafer case is made of polypropylene.

10. A method according to claim 1, wherein said wafer case comprises a wafer basket, a wafer retainer which holds wafers in the wafer basket, a wafer case body in which the wafer basket is received, and a top cover which closes the wafer case body.

* * * * *